(12) United States Patent
Hong

(10) Patent No.: US 7,300,866 B2
(45) Date of Patent: Nov. 27, 2007

(54) METHOD FOR FABRICATING METAL LINE IN A SEMICONDUCTOR

(75) Inventor: Ji-Ho Hong, Suwon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/177,920

(22) Filed: Jul. 8, 2005

(65) Prior Publication Data
US 2006/0009037 A1 Jan. 12, 2006

(30) Foreign Application Priority Data
Jul. 8, 2004 (KR) ...................... 10-2004-0053021

(51) Int. Cl.
*H01L 21/4763* (2006.01)
*H01L 21/44* (2006.01)

(52) U.S. Cl. ...................... 438/637; 438/638; 438/622; 438/687

(58) Field of Classification Search ................ 438/622, 438/637–639, 687
See application file for complete search history.

(56) References Cited

U.S. PATENT DOCUMENTS

| 4,789,648 | A | | 12/1988 | Chow et al. | |
|---|---|---|---|---|---|
| 4,944,836 | A | | 7/1990 | Beyer et al. | |
| 6,566,242 | B1 | * | 5/2003 | Adams et al. | .............. 438/622 |
| 6,589,863 | B1 | * | 7/2003 | Usami | ........................ 438/626 |
| 7,144,811 | B2 | * | 12/2006 | Liu et al. | .................... 438/687 |
| 2005/0001318 | A1 | * | 1/2005 | Won | ........................... 257/751 |
| 2005/0245072 | A1 | * | 11/2005 | Lee et al. | ................... 438/628 |

* cited by examiner

*Primary Examiner*—Chuong A. Luu
(74) *Attorney, Agent, or Firm*—Andrew D. Fortney

(57) ABSTRACT

A metal line is fabricated in a semiconductor device by a method including: forming an etch stop layer on a substrate; forming an interlayer insulating layer on the etch stop layer, the interlayer insulating layer including dual damascene patterns, each respectively having a trench and a via contact hole; forming a barrier metal layer and a line metal layer on the interlayer insulating layer and in the dual damascene patterns; forming an anti-oxidation layer on above the line metal layer; and forming a metal line in the dual damascene patterns by planarizing an entire surface of the anti-oxidation layer.

20 Claims, 2 Drawing Sheets

METHOD FOR FABRICATING METAL LINE IN A SEMICONDUCTOR

CROSS-REFERENCE TO RELATED APPLICATION

This application claims priority to and the benefit of Korean Patent Application 10-2004-0053021, filed in the Korean Intellectual Property Office on Jul. 8, 2004, the entire contents of which are incorporated herein by reference.

BACKGROUND OF THE INVENTION (a) Field of the Invention

The present invention relates to a method for manufacturing a semiconductor device. More particularly, the present invention relates to a method for fabricating a metal line in a semiconductor device.

(b) Description of the Related Art

As a semiconductor device becomes more integrated and smaller sized, a gap between lower and upper metal lines is becoming narrower. When the gap between the lower and upper metal lines becomes narrower, a delay of a time constant may increase and thereby an operation speed of the device may decrease. Therefore, for a narrower gap between the lower and upper metal lines, a semiconductor device should be fabricated more precisely.

FIG. 1A to FIG. 1C are sectional views illustrating a conventional process of forming a multiple layer metal line in a semiconductor device.

As shown in FIG. 1A, a lower metal line 12 is formed on a semiconductor substrate 11 having structures of various circuit elements for a semiconductor device thereon and/or therein (e.g., one or more transistors, capacitors, resistors, diodes, etc.), and then a first etch stop layer 13 is formed on the substrate 11 having the lower metal line 12. Subsequently, a first insulating layer 14a, a second etch stop layer 14b, and a second insulating layer 14c are consecutively formed on the first etch stop layer 13 such that an interlayer insulating layer 14 is formed for insulation between metal lines. Then, the first interlayer insulating layer 14 is etched utilizing a dual damascene etching process so as to form a dual damascene pattern 15.

In more detail, the dual damascene pattern 15 is formed as follows. After the first insulating layer 14a and the second etch stop layer 14b are formed on the first etch stop layer 13, the second etch stop layer 14b is partially etched and then the second insulating layer 14c is formed on the second etch stop layer 14b. Subsequently, a trench 15a is formed by partially etching the second insulating layer 14c, and then a via contact hole 15b partially exposing the lower metal line 12 is formed by partially etching the first insulating layer 14a. Thus, the dual damascene pattern 15 is formed to have the trench 15a and the via contact hole 15b.

As shown in FIG. 1B, a diffusion barrier 16 is formed to cover the semiconductor substrate 11 having the dual damascene pattern 15, and then a copper layer 17 is deposited on the diffusion barrier 16.

When the metal layer 17 is deposited, a top surface of the metal layer 17 undulates due to undulation in an outline of the dual damascene pattern 15 formed on the interlayer insulating layer 14.

For that reason, as a primary planarization process, the top surface of the metal layer 17 is planarized by selectively polishing by a chemical mechanical polishing (CMP) process. That is, the metal layer 17 is polished until the diffusion barrier 16 becomes exposed, and thus the surface of the metal layer 17 becomes more flat.

Subsequently, as shown in FIG. 1C, as a secondary planarization process, another CMP process is performed on the metal layer 17 and the diffusion barrier 16 taking the interlayer insulating layer 14 as an end point, and thereby a metal line is formed in the dual damascene pattern 15. Consequently, an upper metal line 18 is formed in the dual damascene pattern 15 to be connected with the lower metal line 12 through the via contact hole 15b.

However, according to such a conventional method for forming a metal line in a semiconductor device, the metal line may problematically suffer from a dishing phenomenon that is apt to occur in the trench 15a during the secondary planarization process performed for forming the metal line 18 in the dual damascene pattern 15. Such a dishing phenomenon deteriorates an electrical conductivity of the metal line, and it makes a subsequent process become more difficult.

The above information disclosed in this Background section is only for enhancement of understanding of the background of the invention and therefore it may contain information that does not form the prior art that is already known in this country to a person or ordinary skill in the art.

SUMMARY OF THE INVENTION

The present invention has been made in an effort to provide a method for fabricating a metal line in a semiconductor device having advantages of enhancement of performance and yield of the semiconductor device by enhancing planarity of metal line due to forming an anti-oxidation layer on a metal layer for reducing a removal rate of the metal layer.

The above-mentioned dishing phenomenon may be prevented by forming a dummy pattern (for example, a thick dummy metal layer) at a region of the dishing after filling the dual damascene pattern 15 with a metal material of, e.g., copper. However, forming such a dummy pattern may increase the time for the planarization process and cost therefor.

An exemplary method for fabricating a metal line in a semiconductor device according to an embodiment of the present invention includes: forming an etch stop layer on a substrate; forming an interlayer insulating layer on the etch stop layer, the interlayer insulating layer comprising a plurality of dual damascene patterns, each respectively having a trench and at least one via contact hole; forming a barrier metal layer and a line metal layer on the interlayer insulating layer including in the dual damascene patterns; forming an anti-oxidation layer above the line metal layer; and forming a metal line in the dual damascene pattern by polishing (e.g., performing a CMP process on) an entire surface of the anti-oxidation layer.

In various embodiments, a TiN/Ti layer or a TaN/Ta layer may be used as the barrier metal layer; the anti-oxidation layer may be formed before or after a cleaning process, and after an edge bead removal (EBR) process is performed during the step of forming the line metal layer; forming the line metal layer and the anti-oxidation layer may comprise depositing and then annealing; and/or the anti-oxidation layer may be deposited by a spin coating method, a CVD method, a spray method, or a dip method.

DETAILED DESCRIPTION OF THE EMBODIMENTS

An embodiment of the present invention will hereinafter be described in detail with reference to the accompanying drawings.

Figure 2A:
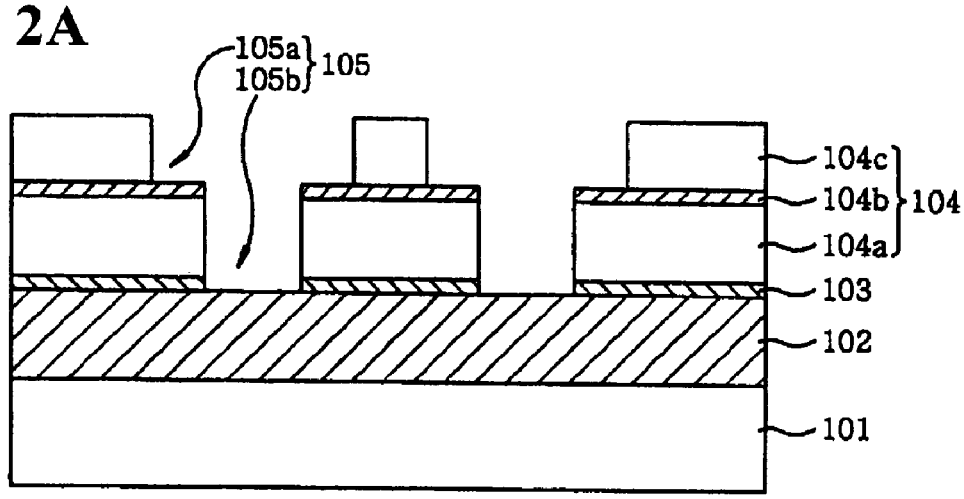
FIG. 2A to FIG. 2C are sectional views illustrating a process of forming a multiple layer metal line in a semiconductor device according to an exemplary embodiment of the present invention.
Figure 2B:
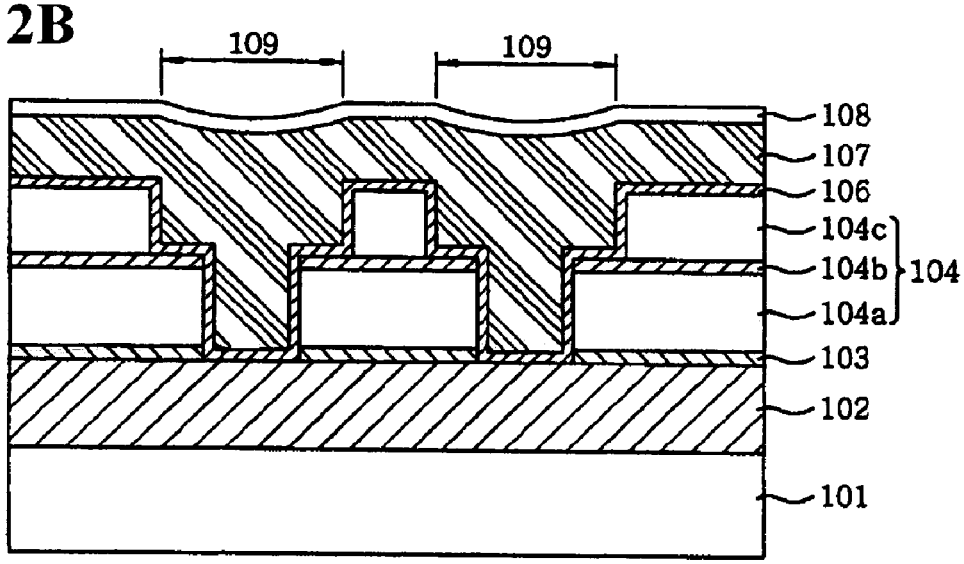
Figure 2C:
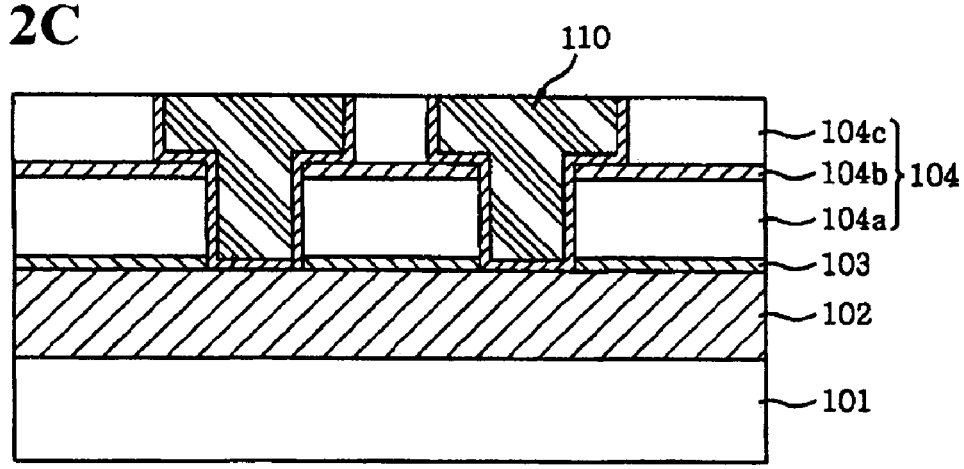

FIG. 2A to FIG. 2C are sectional views illustrating a process of forming a multiple layer metal line in a semiconductor device according to an exemplary embodiment of the present invention.

As shown in FIG. 2A, a lower metal line 102 is formed on a semiconductor substrate 101 having various circuit element structures for a semiconductor thereon and/or therein, generally by conventional photolithographic processing. Thus, the lower metal line 102 generally comprises aluminum or a conventional Al—Cu alloy, which may have one or more barrier layers thereunder (e.g., a stacked Ti/TiN bilayer) and/or one or more capping layers thereover (e.g., a stacked Ti/TiN or Ti/TiW bilayer). Then, a first etch stop layer 103 (e.g., comprising silicon nitride) is formed on the substrate 101 having the lower metal line 102. Subsequently, a first insulating layer 104a (generally comprising silicon dioxide), a second etch stop layer 104b (e.g., silicon nitride), and a second insulating layer 104c (generally comprising silicon dioxide) are consecutively formed on the first etch stop layer 103 such that an interlayer insulating layer 104 is formed for insulation between metal lines. The silicon dioxide for first insulating layer 104a may be doped in part with fluorine (e.g., to form an undoped silicate glass [USG]/fluorosilicate glass [FSG] or USG/FSG/USG stack), or with boron and/or phosphorous (e.g., a borophosphosilicate glass). The material for the second insulating layer 104c is generally selected from those materials for the first insulating layer 104a, but it may be the same as or different from the material(s) for the first insulating layer 104a. Then, the first interlayer insulating layer 104 is etched utilizing a dual damascene etching process so as to form a dual damascene pattern 105.

In more detail, the dual damascene pattern 105 may be formed as follows. After the first insulating layer 104a and the second etch stop layer 104b are formed on the first etch stop layer 103, the second etch stop layer 104b is partially etched and then the second insulating layer 104c is formed on the second etch stop layer 104b. Subsequently, a trench 105a is formed by selectively etching the second insulating layer 104c (e.g., using a first patterned photoresist as a mask), and then a via contact hole 105b partially exposing the lower metal line 102 is formed by selectively etching the first insulating layer 104a (e.g., using a second patterned photoresist as a mask). Thus, the dual damascene pattern 105 generally has a trench 105a and a via contact hole 105b.

Figure 1A:
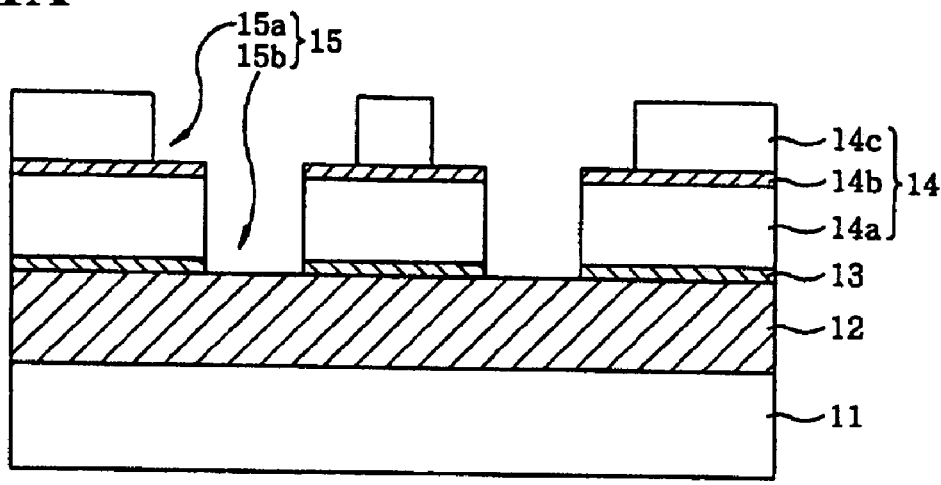
FIG. 1A to FIG. 1C are sectional views illustrating a conventional process of forming a multiple layer metal line in a semiconductor device.
Figure 1B:
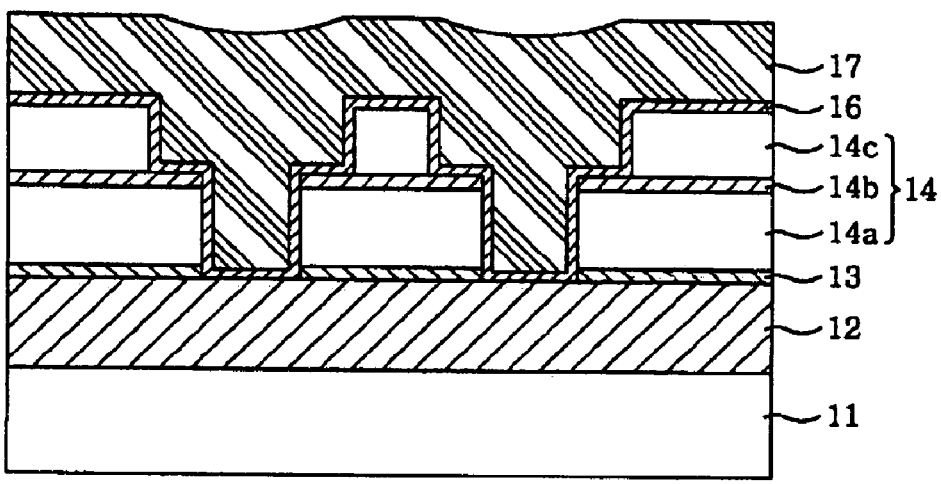
Figure 1C:
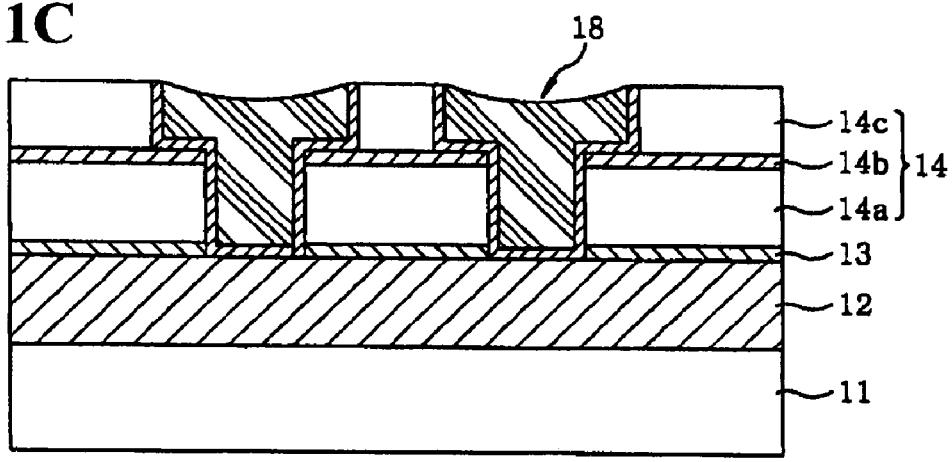

As shown in FIG. 1B, a barrier metal layer 106 is formed to cover the semiconductor substrate 101 having the dual damascene pattern 105, and then a metal layer 107 comprising copper is deposited (generally by electroplating) on the barrier metal layer 106. Then, an anti-oxidation layer 108 is formed to cover the metal layer 107.

When the copper metal layer 107 is deposited without an overlying anti-oxidation layer, a top surface of the metal layer 107 may dip or undulate (that is, dishing area 109 may occur thereon) due to undulation in an outline of the dual damascene pattern 105 formed on the interlayer insulating layer 104, a phenomenon generally known as "dishing" that results from chemical-mechanical polishing of copper or other metal. The anti-oxidation layer 108 generally reduces or prevents deterioration of a characteristic of a semiconductor device by the dishing area 109. The anti-oxidation layer 108 may be formed before or after a cleaning process (e.g., before or after cleaning the substrate having the metal layer 107 thereon), after performing edge bead removal (EBR) during or after forming of the metal layer 107 (e.g., after removing an edge bead from the metal layer 107), or before an annealing process after depositing the copper for forming the metal layer 107 (e.g., after depositing and before annealing the metal layer 107).

The anti-oxidation layer 108 may be formed on the metal layer 107 by various methods, such as spin coating, a chemical vapor deposition (CVD) method, spraying (e.g., spraying a solution of antioxidizing material onto the metal layer 107), dipping (e.g., dipping the wafer or substrate having the metal layer 107 thereon into a solution of antioxidizing material), and an exposure method (e.g., exposing the metal layer 107 to a vapor or gas containing one or more antioxidizing materials). In the dip method, the anti-oxidation layer 108 covers the metal layer 107 by dipping the semiconductor substrate 101 with the metal layer thereon 107 into an anti-oxidizing material. In the exposure method, the semiconductor substrate 101 having an exposed metal layer 107 thereon is exposed to a chemical material for preventing oxidization.

In general, the anti-oxidation layer may comprise various materials (for example, various kinds of polymeric films, such as thermoplastic resins, conventional resist polymers, etc.; dielectric films, gold coatings, chromate films, etc.). Among these materials, a chromate film that may be formed by an electrolytic chromate treatment of the wafer or substrate having the metal layer 107 thereon may be preferred. However, the same effect may be achieved to a similar degree by any of the exemplary materials listed above.

Since the anti-oxidation layer 108 is formed on the metal layer 107 as such, the metal layer 107 may be protected from an oxidizing agent used during planarization during a later-described planarization or polishing process (i.e., a CMP process).

Subsequently, as shown in FIG. 2C, a polishing (CMP) process is performed to a degree that a surface of the second insulating layer 104c may be exposed. By such a process, the surfaces of the metal layer 107 and the anti-oxidation layer 108 become planarized, and thereby the upper metal line 110 is formed. In fact, the anti-oxidation layer 108 may be completely removed by the polishing process, and in general, the surfaces of the metal layer 107 and the second insulating layer 104c may become coplanar.

In more detail, during the CMP process, the dishing area 109 is more planarized by a chemical polishing or etching mechanism than by a mechanical polishing mechanism (i.e., it is planarized by removing the copper of the metal layer 107 after changing it into an ionic state by an oxidizing agent, such as an acid). The barrier metal layer 106, the metal layer 107, and the anti-oxidation layer 108 formed above the uppermost surface of the second insulating layer 104c may be removed by a mechanical polishing mechanism more than by a chemical polishing mechanism. Here, when the metal layer 107 in the dishing area 109 is removed by the oxidizing agent, the anti-oxidation layer 108 lowers an oxidation rate of the metal layer 107. Therefore, the metal layer 107 may be removed to a lesser degree at the dishing area 109 than an area above the uppermost surface of the second insulating layer 104c. Therefore, the dishing phenomenon becomes lessened, and the upper metal line 110 may be more planarized or more flat.

As described above, according to an exemplary method for fabricating a metal line in a semiconductor device, performance and yield of the semiconductor device may be improved by enhancing planarity of metal line due to forming an anti-oxidation layer on a metal layer. The anti-oxidation layer is believed to reduce a removal rate of the metal layer in locations where dishing may occur. In addition, since an anti-oxidation layer is formed above a metal layer, the metal layer may be deposited at a minimal thickness in order to minimize the amount of the metal layer to be removed by a planarization or CMP process. Therefore, the time and cost for the CMP process may be reduced, and waste water containing a heavy metal may also be reduced.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for fabricating a metal line in a semiconductor device, comprising:
    forming an etch stop layer on a substrate;
    forming an interlayer insulating layer on the etch stop layer, the interlayer insulating layer comprising a plurality of dual damascene patterns, each respectively having a trench and at least one via contact hole;
    forming a barrier metal layer and a line metal layer on the interlayer insulating layer including in the dual damascene patterns;
    performing an edge bead removal (EBR) process;
    forming an anti-oxidation layer above the line metal layer;
    cleaning the semiconductor device; and
    forming a metal line in the dual damascene pattern by planarizing an entire surface of the anti-oxidation layer and exposing a surface of the interlayer insulating layer.

2. The method of claim 1, the barrier metal layer comprises a metal/metal nitride bilayer.

3. The method of claim 1, comprising performing the edge bead removal (EBR) process during or after the step of forming the line metal layer, then cleaning the semiconductor device before the step of forming the anti-oxidation layer.

4. The method of claim 1, comprising performing the edge bead removal (EBR) process during or after the step of forming the line metal layer, then cleaning the semiconductor device after the step of forming the anti-oxidation layer.

5. The method of claim 1, wherein forming the line metal layer comprises depositing and then annealing the line metal layer.

6. The method of claim 2, wherein forming the line metal layer comprises depositing and then annealing the line metal layer.

7. The method of claim 3, wherein forming the line metal layer comprises depositing and then annealing the line metal layer.

8. The method of claim 4, wherein forming the line metal layer comprises depositing and then annealing the line metal layer.

9. The method of claim 1, wherein depositing the anti-oxidation layer comprises spin coating, CVD, spraying, or dipping.

10. The method of claim 2, wherein depositing the anti-oxidation layer comprises spin coating, CVD, spraying, or dipping.

11. The method of claim 3, wherein depositing the anti-oxidation layer comprises spin coating, CVD, spraying, or dipping.

12. The method of claim 4, wherein depositing the anti-oxidation layer comprises spin coating, CVD, spraying, or dipping.

13. The method of claim 5, wherein depositing the anti-oxidation layer comprises spin coating, CVD, spraying, or dipping.

14. The method of claim 6, wherein depositing the anti-oxidation layer comprises spin coating, CVD, spraying, or dipping.

15. The method of claim 7, wherein depositing the anti-oxidation layer comprises spin coating, CVD, spraying, or dipping.

16. The method of claim 8, wherein depositing the anti-oxidation layer comprises spin coating, CVD, spraying, or dipping.

17. The method of claim 1, wherein the step of planarizing the entire surface of the anti-oxidation layer comprises polishing the anti-oxidation layer, the line metal layer and the barrier metal layer.

18. The method of claim 1, wherein the barrier metal layer comprises a TiN/Ti layer or a TaN/Ta layer.

19. The method of claim 1, wherein the anti-oxidation layer comprises a member selected from the group consisting of polymeric films, dielectric films, gold coatings and chromate films.

20. The method of claim 1, wherein the line metal layer comprises a Cu layer.

* * * * *